(12) United States Patent
Goh et al.

(10) Patent No.: US 7,956,475 B2
(45) Date of Patent: Jun. 7, 2011

(54) STEP CAVITY FOR ENHANCED DROP TEST PERFORMANCE IN BALL GRID ARRAY PACKAGE

(75) Inventors: Kim-Yong Goh, Singapore (SG); Jing-En Luan, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 75 days.

(21) Appl. No.: 12/336,273

(22) Filed: Dec. 16, 2008

(65) Prior Publication Data

US 2010/0148363 A1    Jun. 17, 2010

(51) Int. Cl.
*H01L 23/28* (2006.01)
(52) U.S. Cl. .......................................... 257/787; 257/730
(58) Field of Classification Search ................. 257/787, 257/790, 792, 793, 730; 438/127, 126, 124, 438/112
See application file for complete search history.

(56) References Cited

U.S. PATENT DOCUMENTS

| | | | |
|---|---|---|---|
| 5,708,300 A * | 1/1998 | Woosley et al. | 257/730 |
| 6,664,647 B2 * | 12/2003 | Kasuga et al. | 257/787 |
| 6,841,424 B2 * | 1/2005 | Bolken | 438/127 |
| 6,873,060 B2 * | 3/2005 | Blaszczak et al. | 257/787 |
| 7,095,097 B2 * | 8/2006 | Tandy et al. | 257/666 |

\* cited by examiner

*Primary Examiner* — S. V Clark
(74) *Attorney, Agent, or Firm* — Lisa K. Jorgenson; Andre M. Szuwalski

(57) ABSTRACT

A ball grid array (BGA) package includes a substrate layer having first and second sides. A semiconductor chip is attached to the first side of the substrate layer by a dielectric adhesive layer. A plurality of solder balls are attached to the second side of the substrate layer. The solder balls may be set out by rows and columns. A plurality of wires electrically connect the semiconductor chip to the solder balls. A layer of encapsulating compound is deposited over the semiconductor chip. A step cavity of a selected depth and shape is formed in the layer of encapsulating compound at or near the edge or periphery of the layer of encapsulating compound. The step cavity is separated from the solder balls by the substrate layer but spans over a plurality of selected solder balls.

14 Claims, 7 Drawing Sheets

*FIG. 8D* SAW LINE

US 7,956,475 B2

STEP CAVITY FOR ENHANCED DROP TEST PERFORMANCE IN BALL GRID ARRAY PACKAGE

FIELD OF THE INVENTION

The invention relates to semiconductor packaging, and more particularly the invention relates to a step cavity for enhanced drop test performance in ball grid array (BGA) semiconductor packages.

BACKGROUND OF THE INVENTION

In device assembly, a drop test is often used to measure the durability of a component (e.g., a circuit board with attached integrated circuits) by subjecting it to a free fall from a predetermined height into a surface under prescribed conditions. For example, the drop test is applied to circuit boards on which ball grid array (BGA) packages are mounted to measure the impact from a mechanical shock.

BGA packages are typically produced in matrix form, which are then block molded and sawn into units. FIG. 1 illustrates a typical single BGA package 100 including a substrate layer 104 on one side of which is attached a semiconductor chip 108. The semiconductor chip 108 is preferably attached to the substrate layer 104 by a dielectric adhesive layer 124. A plurality of solder balls 116, which are attached to the other side of the substrate layer 104, are electrically connected to the semiconductor chip 108 via wires 120 and vias (not shown) which extend through the substrate layer 104. A layer of compound material 112 is deposited over the semiconductor chip 108 to encapsulate the semiconductor chip 108. The compound material 112 may be an epoxy resin-type material. The BGA package 100 is typically mounted on a printed circuit board (PCB) for installation in electronic devices and systems.

FIG. 2 illustrates a typical PCB 204 on which is mounted a BGA package 208. The PCB 204 when subjected to a drop test is deformed due to the impact from a mechanical shock. FIGS. 3 and 4 illustrate the PCB 204 during a drop impact. As shown in FIGS. 3 and 4, the PCB 204 is bent upward or downward depending on the orientation during the impact. The BGA package 208 mounted on the PCB 204 tends to follow the deformation of the PCB 204, which leads to uneven loading of the solder balls 212. In particular, as the size of the semiconductor chip 208 increases, the solder balls on the periphery are subjected to increased loading and deformation because they are farther away from a neutral axis 216. Increase in the thickness of the package also causes the semiconductor chip 208 to become less compliant to bending, thus adding to the stress applied at the edges/corners of the package. FIG. 5 is a plot illustrating the simulation result of a BGA package's drop test characteristic versus size. As the size of the BGA package increases, its drop test characteristic decreases exponentially. The larger the package, the fewer drops it takes before failure, which is a significant concern as package sizes are increasing.

SUMMARY OF THE EMBODIMENTS

A ball grid array (BGA) package includes a substrate layer having first and second sides. A semiconductor chip is attached to the first side of the substrate layer, and a plurality of solder balls are attached to the second side of the substrate layer. A layer of encapsulating compound is deposited over the semiconductor chip to encapsulate the chip. A step cavity of a selected depth and width is formed at an edge of the layer of encapsulating compound. The layer of encapsulating compound has a first height spanning the step cavity and a second height greater than the first height spanning the remaining area of the layer of encapsulating compound. The encapsulating layer has four edges. The step cavity spans along the four edges of the layer of encapsulating compound. The step cavity is separated from the solder balls by the substrate layer but spans at least outermost solder balls.

In another embodiment, a BGA package having four corners includes a substrate layer having first and second sides. A semiconductor chip is attached to the first side of the substrate layer by a dielectric adhesive layer, and a plurality of solder balls are attached to the second side of the substrate layer. A layer of encapsulating compound is deposited over the semiconductor chip. The layer of encapsulating compound has four corners. A step cavity of a selected depth is formed in the layer of encapsulating compound at the four corners.

In another embodiment, a BGA package includes a substrate layer having first and second sides. A semiconductor chip is attached to the first side of the substrate layer, and a plurality of solder balls are attached to the second side of the substrate layer. A layer of encapsulating compound is deposited over the semiconductor chip. The layer of encapsulating compound has four corners. A step cavity of a selected size and a depth is formed in the layer of encapsulating compound near each of the four corners of the layer of encapsulating compound but offset from edges of the layer of encapsulating compound.

BRIEF DESCRIPTION OF THE DRAWINGS

For a more complete understanding of the features, example embodiments and possible advantages of the present invention, reference is now made to the detailed description of the invention along with the accompanying figures and in which:

FIGS. 8A-8E illustrate an assembly process for a BGA package with a step cavity;

DETAILED DESCRIPTION OF THE INVENTION

Figure 1:
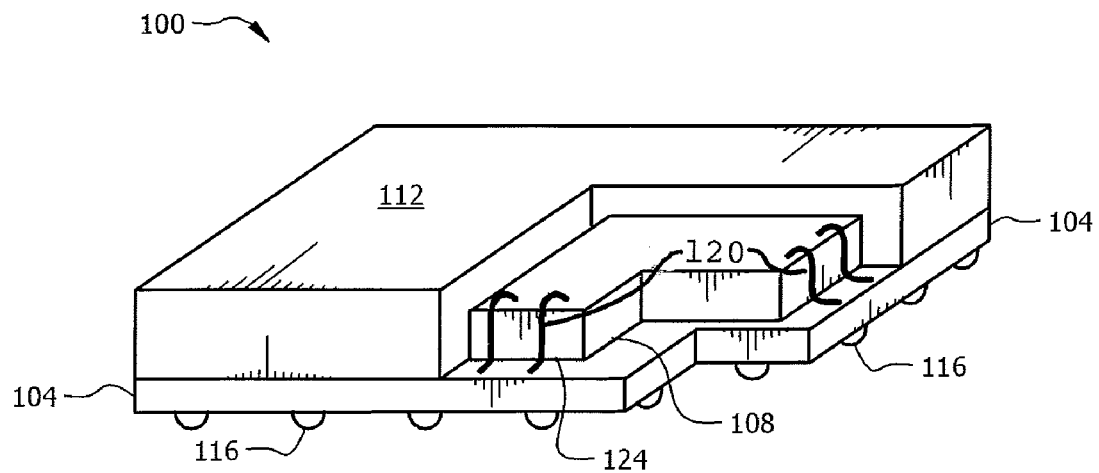
FIG. 1 illustrates a typical single BGA package.
Figure 2:
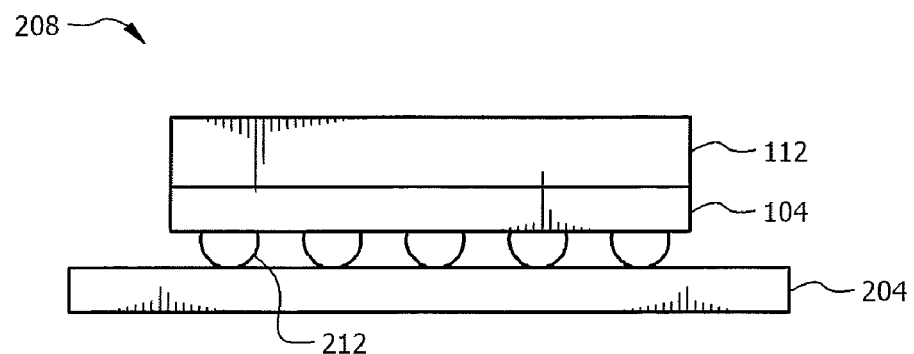
FIG. 2 illustrates a typical PCB on which is mounted a BGA package.
Figure 3:
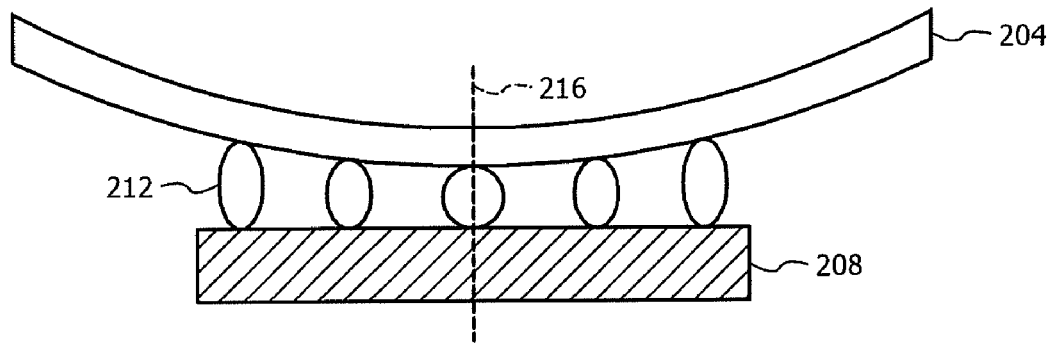
FIGS. 3 and 4 illustrate the impact of a drop test on a PCB.
Figure 4:
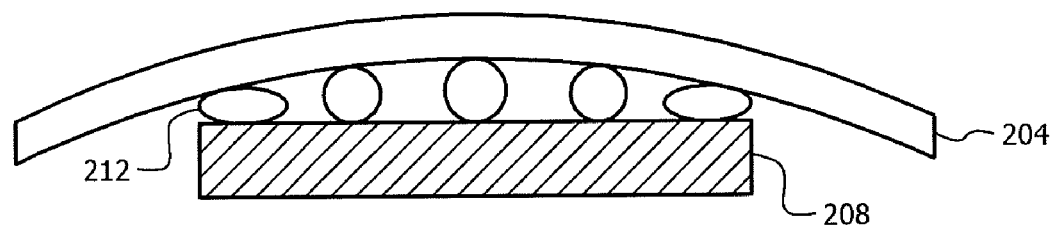
Figure 5:
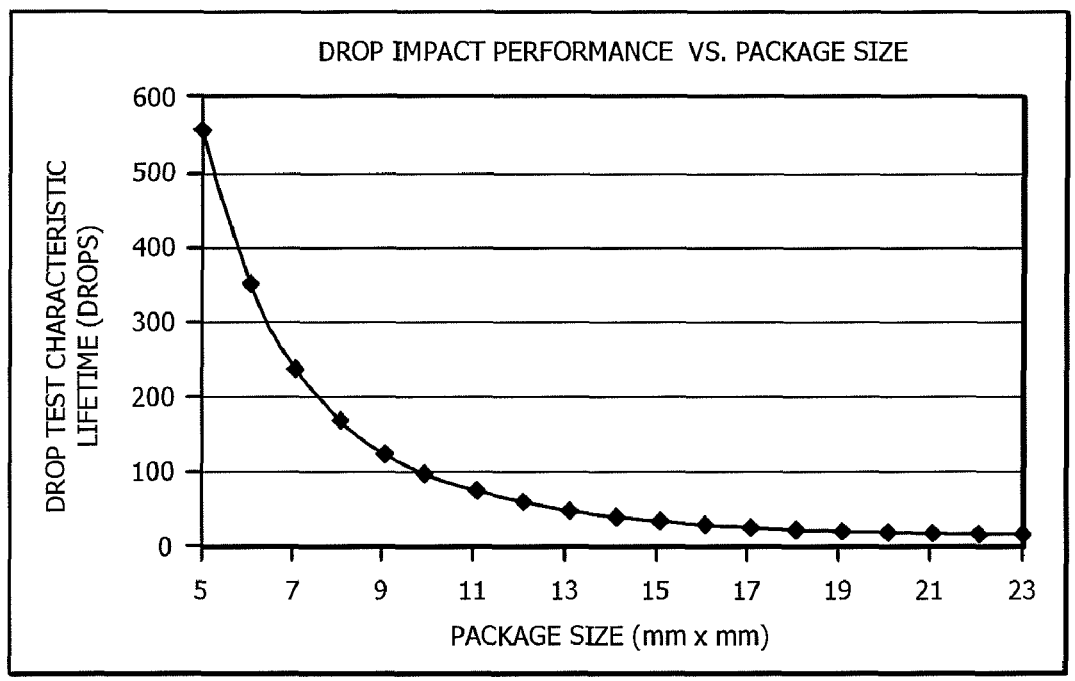
FIG. 5 is a plot illustrating the simulation result of a BGA package's drop test characteristic versus size.
Figure 6:
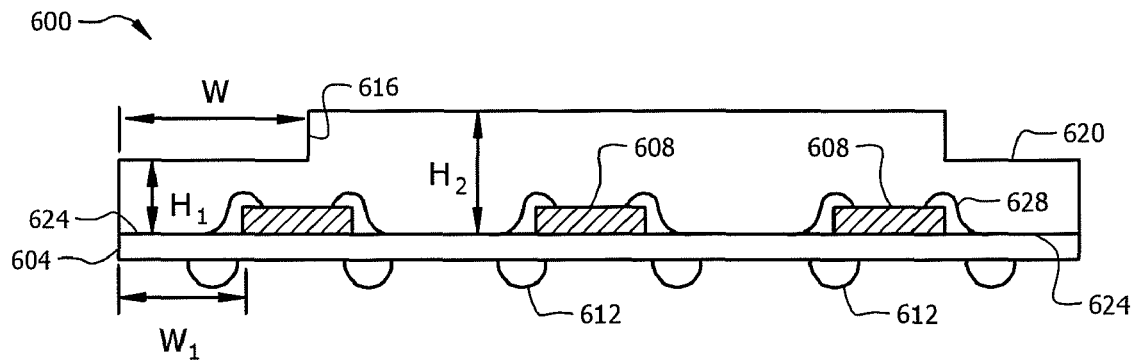
FIG. 6 is a BGA package in accordance with one embodiment.

FIG. 6 illustrates a BGA package 600 in accordance with one embodiment. The BGA package 600 includes a substrate layer 604 on one side of which is attached one or more semiconductor chips 608. In one implementation, the semiconductor chips 608 may be attached to the substrate layer 604 by a dielectric adhesive layer 624.

A plurality of solder balls 612 are attached to the other side of the substrate layer 604. In one implementation, the solder balls 612 may be set out in an array of rows and columns. A plurality of wires 628 electrically connect the semiconductor chips 608 to the solder balls 612. Vias (not shown) through the substrate layer 604 connect the solder balls 612 to the wires 628.

A layer of encapsulating compound 616 is deposited over the semiconductor chips 608 and formed into a parallelepiped-shaped encapsulating structure. The layer of encapsulating compound 616 protects the semiconductor chips 608 from mechanical shock, vibration and environmental effects. In one implementation, the encapsulating compound is an epoxy resin-type material. A step cavity 620 of a selected width (W) and depth (H1) is made in an upper surface of the layer 616 at the periphery of the package 600. In one implementation, the step cavity 620 is made by removing material from the periphery of the layer of encapsulating compound 616.

The width W of the step cavity 620 must be greater than a width W1. As illustrated in FIG. 6, W1 is a distance measured from the edge of the package 600 and is adequate to overlap the outermost rows and columns of the solder balls 612. Thus, the width W of the step cavity 620 spans at least the width W1.

As a result of the step cavity 620 depth H1, the layer of encapsulating compound 616 has a first thickness H1 spanning the width W and a second thickness H2 spanning the remaining area of the, the second thickness H2 being greater than the first thickness H1.

The step cavity 620 decreases the thickness of the encapsulating layer at the peripheral edges and thus makes the BGA package 600 more compliant to bending during a drop test, thus improving its drop impact performance. Because the outermost solder balls are subjected to maximum stress and loading during a drop test, the step cavity 620 provides stress relief to the outermost solder balls by reducing stiffness at the periphery of the BGA package 600.

Figure 7:
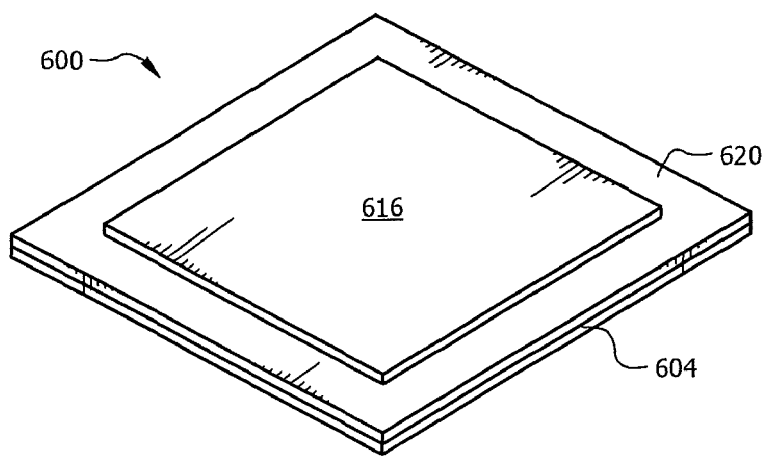
FIG. 7 illustrates a perspective view of a BGA package in accordance with one embodiment.

FIG. 7 illustrates a perspective view of the BGA package 600. The BGA package 600 includes the substrate layer 604 on one side of which is attached a semiconductor chip (not shown in FIG. 7). The layer of encapsulating compound 616 is deposited over the semiconductor chip. The step cavity 620 is made in the layer of encapsulating compound 616 at the periphery or edge of the package 600 by removing material from the periphery.

In one implementation, the BGA package with the step cavity is made by forming a substrate layer having first and second sides. A semiconductor chip is attached to the first side of the substrate layer and a plurality of solder balls are attached to the second side of the substrate layer. A layer of encapsulating compound is deposited over the semiconductor chip to encapsulate the semiconductor chip. A step cavity of a selected depth and width is made in the layer at the periphery of the package by removing compound material after the encapsulating layer has been formed. Alternatively, the step cavity can be formed into a mold used to define the shape of the encapsulating layer.

FIGS. 8A-8E illustrate an exemplary assembly process for a BGA package 600 in accordance with the embodiment shown in FIG. 6. In particular, FIGS. 8A-8E illustrate how a BGA block mold 800 is processed for making the BGA package 600 shown in FIG. 6.

Figure 8A:
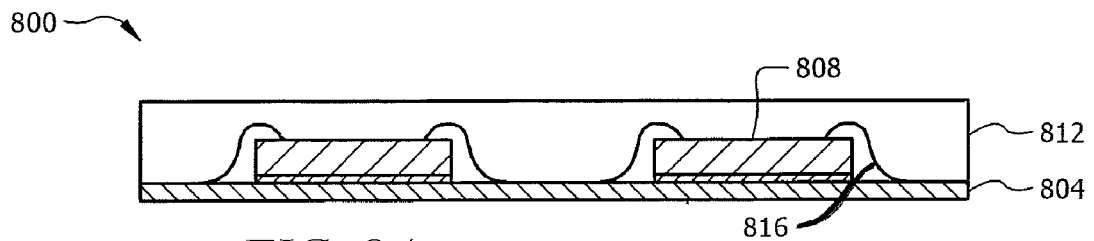

FIG. 8A shows a BGA block mold 800, which includes a substrate layer 804 on one side of which is attached one or more semiconductor chips 808. A plurality of wires 816 are attached to the semiconductor chips 808 for connection to solder balls (not shown in FIG. 8A). A layer of encapsulating compound 812 is deposited over the semiconductor chips 808 to encapsulate the semiconductor chips 808.

Figure 8B:
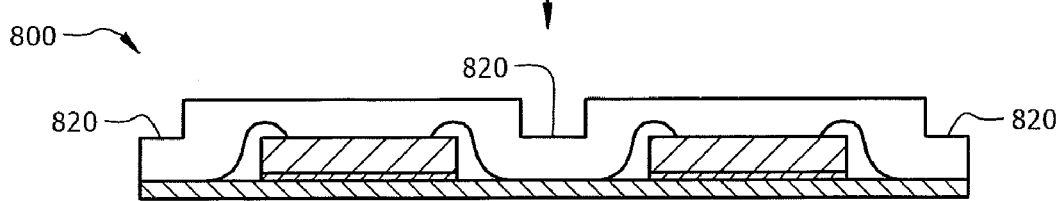

FIG. 8B shows step cavities 820 being created by milling or half-saw process. The step cavities are created in the upper surface of the layer of encapsulating compound 812 near the periphery of the block mold 800. As will be shown, the step cavity at the center indicated by the reference numeral 820 will be transformed into two step cavities each at the periphery of a package when the block mold 800 is sawed into two units.

Figure 8C:
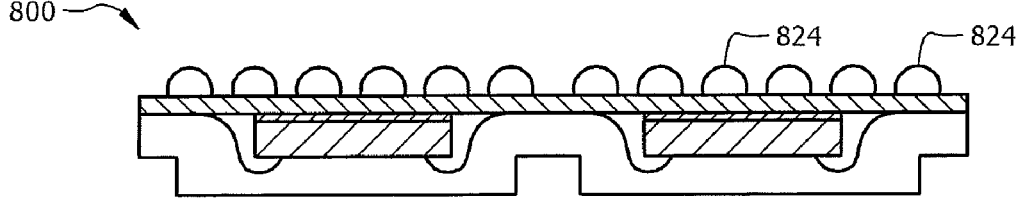
Figure 8E:
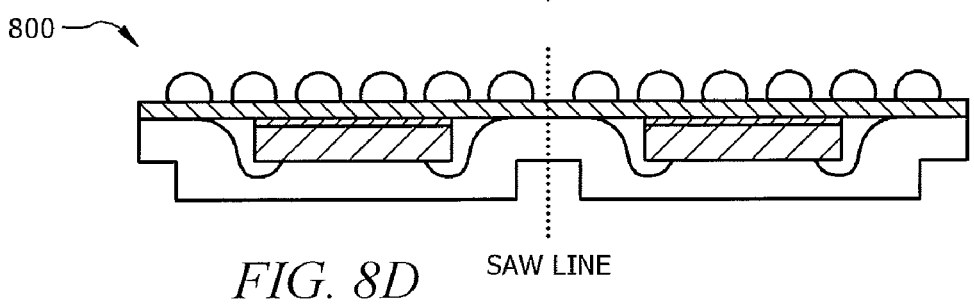
Figure 8E:
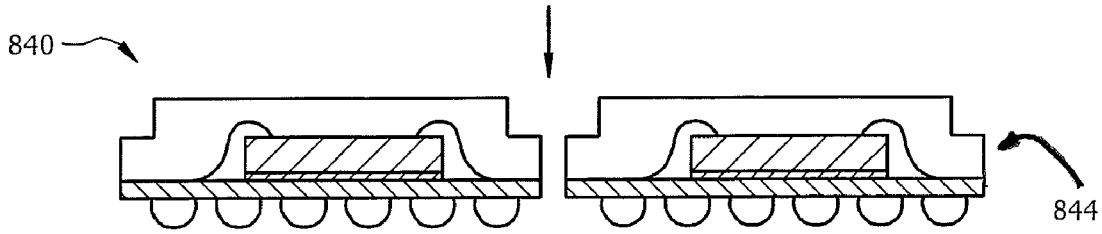

FIG. 8C shows solder balls 824 being attached to the BGA block mold 800. FIGS. 8D and 8E show a sawing process along a saw line to create two singulated BGA packages 844 and 840.

Figure 9:
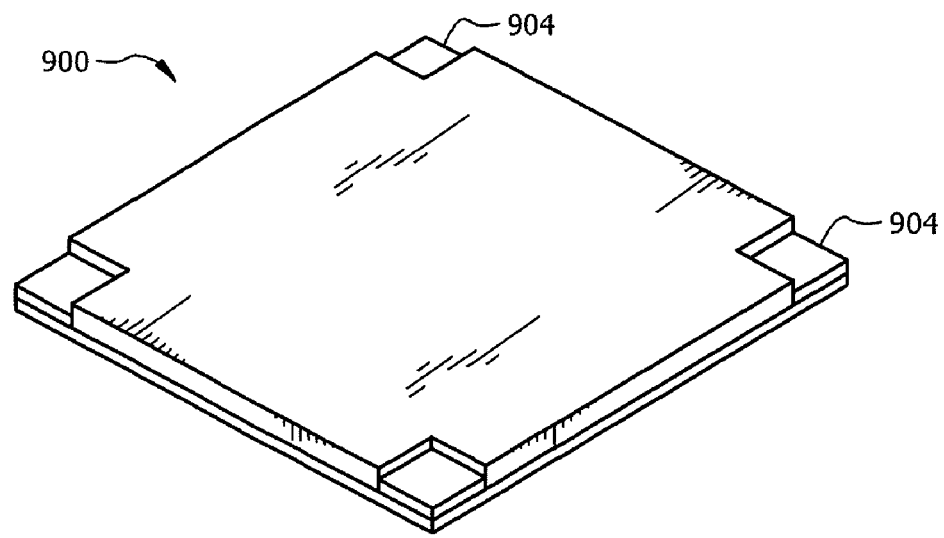
FIGS. 9 to 11 illustrate BGA packages in accordance with other embodiments.

In one embodiment, a step cavity is made only in the four corners of a BGA package. FIG. 9 illustrates a BGA package 900 which has a step cavity 904 in each of its four corners (of a square or rectangular shape). The area in each step cavity 904 is generally greater than the area covering at least the outermost corner solder balls (not shown in FIG. 9). Thus, the area in each step cavity 904 spans over at least the outermost corner solder balls (although the outermost corner solder balls are not in contact with the step cavity 904).

Figure 10:
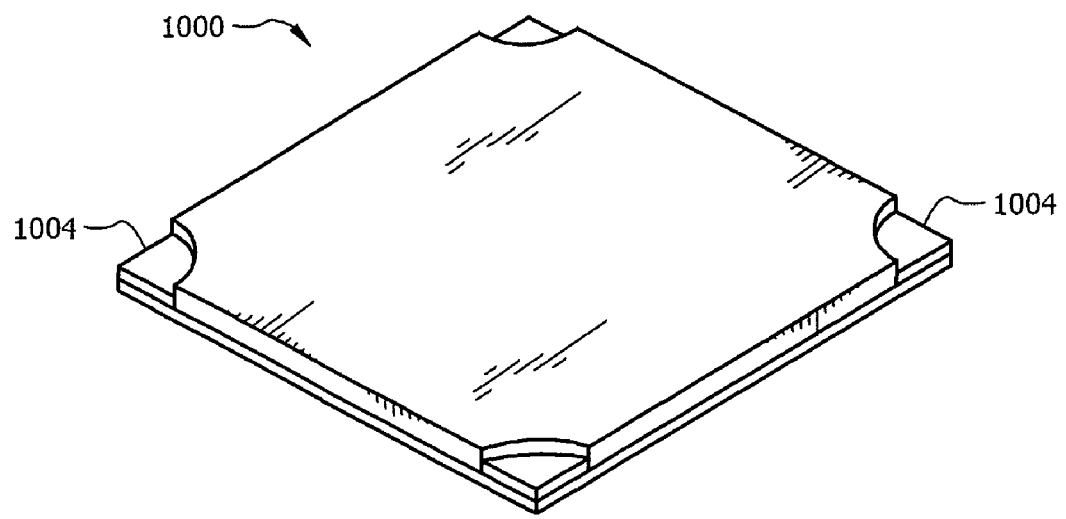

An advantage of the BGA package 900 is the availability of increased area for placement of semiconductor chips or dice in the periphery of the package not taken up by the step cavities. The step cavities 904 may be square (as shown in FIG. 9), round, oval, rectangular or may have any other shapes. FIG. 10 shows a BGA package 1000 with a step cavity 1004 only its four corners, the step cavities being arc-shaped (quarter-circular).

Figure 11:
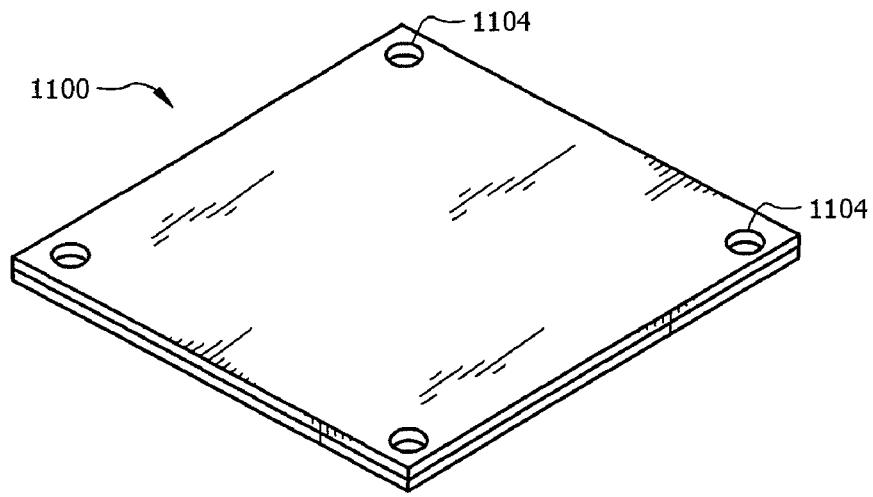

In another implementation, a BGA package 1100 shown in FIG. 11 has a step cavity 1104 formed close to each of the four corners of the package 1100 but is slightly offset from the periphery or edge. The step cavities 1104, which are formed on the upper surface, are located close to the four corners but spaced from the periphery or edge 1112 of the package 1100. Each step cavity 1104 is generally aligned with an outermost corner solder ball (not shown in FIG. 11) that is separated from the step cavity 1104 by the substrate layer but lie below the step cavity 1104. The area of each step cavity 1104 is greater than the area covering at least the outermost corner solder balls. While the step cavities 1104 are illustrated as round apertures, it will be understood that they may have other shapes (e.g., square, rectangular, oval, etc.)

Figure 12:
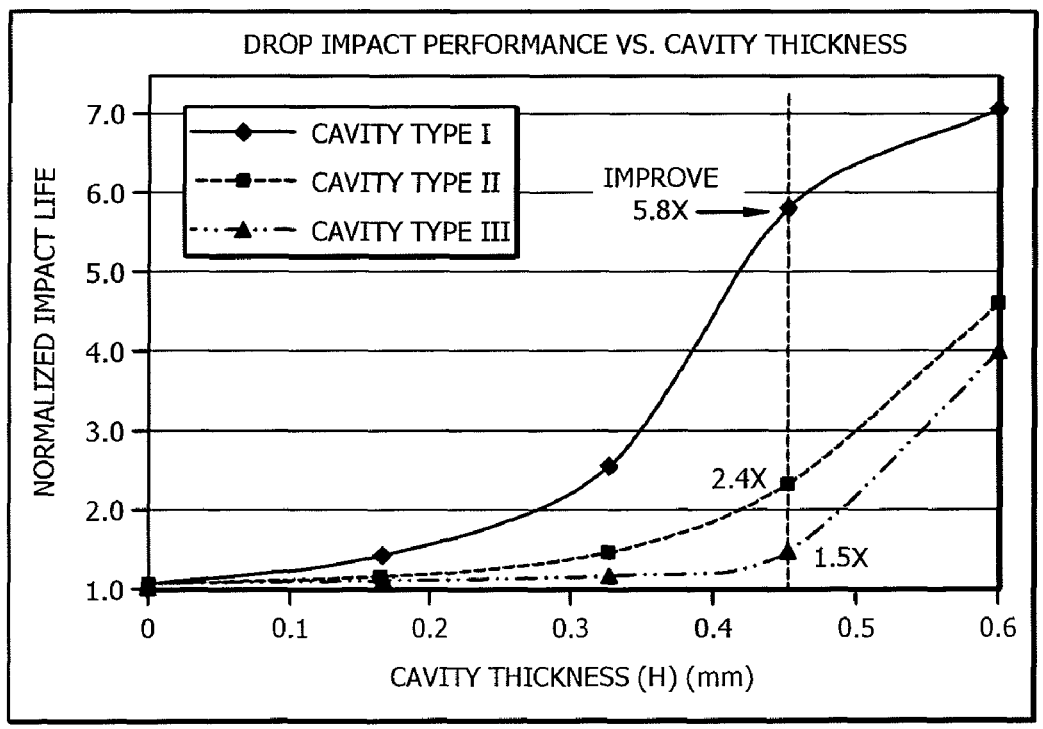
FIG. 12 illustrates a simulated drop test performance of BGA packages with three types of step cavity.

The BGA packages in accordance with the embodiments discussed above exhibited improved drop test performance, especially for large package size (>12 mm×12 mm) where impact performance is critical to pass typical customer requirements. The BGA packages do not require the incorporation of dummy solder balls for stress relief, thereby increasing the usable area for active interconnects. FIG. 12 illustrates a simulated drop test performance of BGA packages with three types of step cavity. Type I is the embodiment of FIG. 7, Type II is the embodiment of FIG. 10, and Type III is the embodiment of FIG. 11. FIG. 12 shows that as the height (H) of the cavity increases, the drop test performance (indicated by a normalized impact on the vertical axis) improves. Notably, for a cavity height (H) of approximately 0.45 mm, Type I exhibits 5.8× improvement over a conventional package without a step cavity, Type II exhibits 2.4× improvement and Type III exhibits 1.5× improvement. The simulations were performed for 12 mm×12 mm, 0.8 pitch packages.

It will also be appreciated that one or more of the elements depicted in the drawings/figures can also be implemented in a more separated or integrated manner, or even removed or rendered as inoperable in certain cases, as is useful in accordance with a particular application.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. A ball grid array (BGA) package having four corners, comprising:
    a substrate layer having first and second sides;
    a semiconductor chip attached to the first side of the substrate layer by a dielectric adhesive layer;
    a plurality of solder balls attached to the second side of the substrate layer;
    a layer of encapsulating compound deposited over the semiconductor chip, the layer of encapsulating compound having an outer peripheral edge defined by four sides and four corners; and
    a step cavity of a selected depth formed in the layer of encapsulating compound solely at the four corners of the layer of encapsulating compound, at least a portion of the outer peripheral edge at each of the four sides not having the step cavity.

2. The BGA package according to claim 1, wherein the step cavity at each corner is square-shaped.

3. The BGA package according to claim 1, wherein the step cavity at each corner is rectangular-shaped.

4. The BGA package according to claim 1, wherein the step cavity at each corner is arc-shaped.

5. The BGA package according to claim 1, wherein the layer of encapsulating compound has a first height spanning the step cavity and a second height greater than the first height spanning the remaining area of the layer of encapsulating compound.

6. The BGA package according to claim 1, wherein the step cavity is separated from the solder balls by the substrate layer but spans at least outermost corner solder balls.

7. The BGA package according to claim 1, wherein the step cavity at each corner is an aperture formed in the top surface of the layer of encapsulating compound.

8. A ball grid array (BGA) package, comprising:
    a substrate layer having first and second sides;
    a semiconductor chip attached to the first side of the substrate layer;
    a plurality of solder balls attached to the second side of the substrate layer;
    a layer of encapsulating compound deposited over the semiconductor chip, the layer having a flat top surface and an outer peripheral edge defined by four sides and four corners; and
    a plurality of openings each of a selected size and a depth formed in the flat top surface of encapsulating compound, the openings extending into the flat top surface and the openings in the flat top surface being completely offset from the outer peripheral edge at a location near each of the four corners of the layer of encapsulating compound.

9. The BGA package according to claim 8, wherein each opening is separated from the solder balls by the substrate layer but is positioned above at least outermost corner ones of the plurality of solder balls.

10. The BGA package according to claim 8, wherein each opening is a round aperture.

11. The BGA package according to claim 8, wherein each opening is a square aperture.

12. The BGA package according to claim 8, wherein each opening is an oval aperture.

13. The BGA package according to claim 8, wherein each opening is a rectangular aperture.

14. The BGA package according to claim 8, wherein the layer of encapsulating compound has a first height at the location of each opening and a second height greater than the first height at the outer peripheral edge, sides and corners and spanning the flat top surface of the layer of encapsulating compound other than at opening locations.

\* \* \* \* \*

UNITED STATES PATENT AND TRADEMARK OFFICE
CERTIFICATE OF CORRECTION

| | | |
|---|---|---|
| PATENT NO. | : 7,956,475 B2 | Page 1 of 1 |
| APPLICATION NO. | : 12/336273 | |
| DATED | : June 7, 2011 | |
| INVENTOR(S) | : Goh et al. | |

It is certified that error appears in the above-identified patent and that said Letters Patent is hereby corrected as shown below:

In the Specification:

At column 4, line number 33, please delete "1112".

Signed and Sealed this
Ninth Day of August, 2011

David J. Kappos
*Director of the United States Patent and Trademark Office*